(12) United States Patent
Goldberg

(10) Patent No.: US 6,307,635 B1
(45) Date of Patent: *Oct. 23, 2001

(54) PHASE-SHIFTING POINT DIFFRACTION INTERFEROMETER MASK DESIGNS

(75) Inventor: Kenneth Alan Goldberg, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/176,617

(22) Filed: Oct. 21, 1998

(51) Int. Cl.$^7$ .................................................. G01B 9/02
(52) U.S. Cl. ........................... 356/521; 356/458; 356/520
(58) Field of Search .................................... 356/354, 356, 356/450, 512, 521, 515

(56) References Cited

U.S. PATENT DOCUMENTS 6,111,646 * 8/2000 Naulleau et al. ..................... 356/354

OTHER PUBLICATIONS

Naulleau, Patrick, et al. "Characterization of the accuracy of EUV phase–shifting point diffraction interferometry", *SPIE*, v. 3331 (1998) 114–123.

Anderson, Erik H., et al., "Electron beam lithography digital pattern generator and electronics for generalized curvilinear structures", *J. Vac. Sci. Technol.B,* vol. 13, No. 6, (1995) 2529–2534.

Brophy, Chris P., "Effect of intensity error correlation on the computed phase of phase–shifting interferometry", *J. Opt. Soc. Am. A,* vol. 7, No. 4 (1990) 537–541.

Medecki, H., et al., "Phase–shifting point diffraction interferometer" *Optics Letters,* vol. 21, No. 19 (1996) 1526–1528.

* cited by examiner

Primary Examiner—Frank G. Font
Assistant Examiner—Andrew H. Lee
(74) Attorney, Agent, or Firm—Burns, Doane, Swecker & Mathis, L.L.P.

(57) ABSTRACT

In a phase-shifting point diffraction interferometer, different image-plane mask designs can improve the operation of the interferometer. By keeping the test beam window of the mask small compared to the separation distance between the beams, the problem of energy from the reference beam leaking through the test beam window is reduced. By rotating the grating and mask 45°, only a single one-dimensional translation stage is required for phase-shifting. By keeping two reference pinholes in the same orientation about the test beam window, only a single grating orientation, and thus a single one-dimensional translation stage, is required. The use of a two-dimensional grating allows for a multiplicity of pinholes to be used about the pattern of diffracted orders of the grating at the mask. Orientation marks on the mask can be used to orient the device and indicate the position of the reference pinholes.

26 Claims, 4 Drawing Sheets

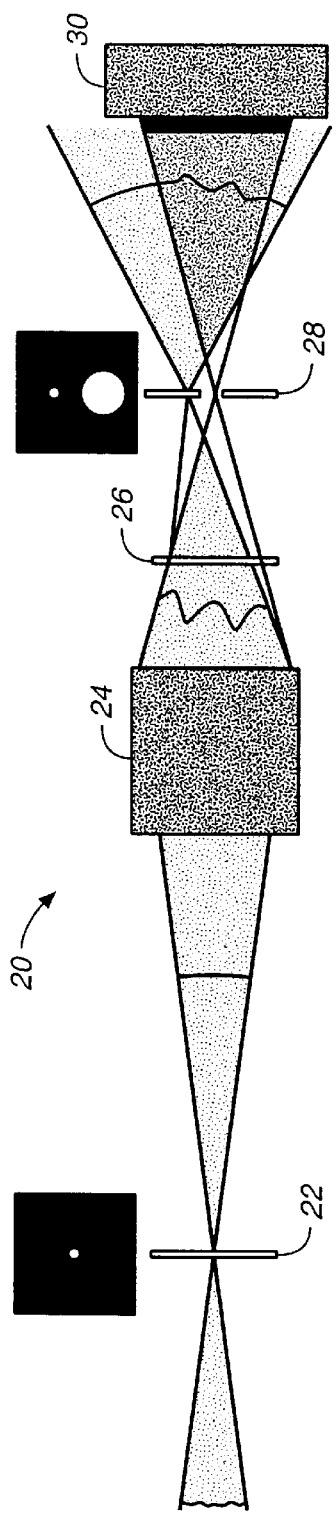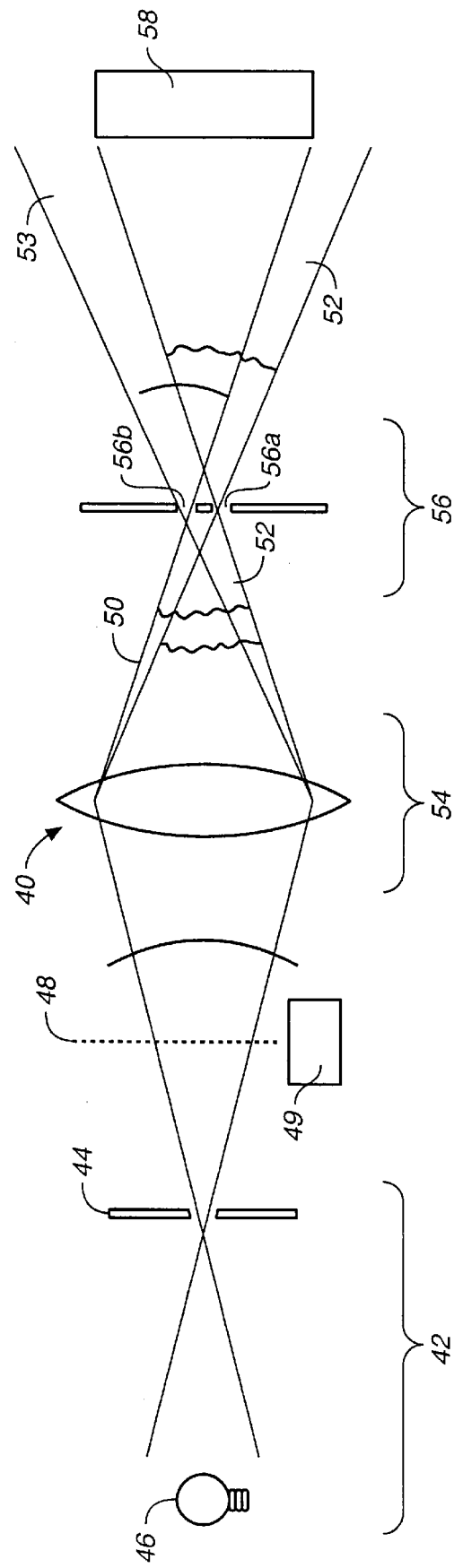
FIG._1 (PRIOR ART)
FIG._2

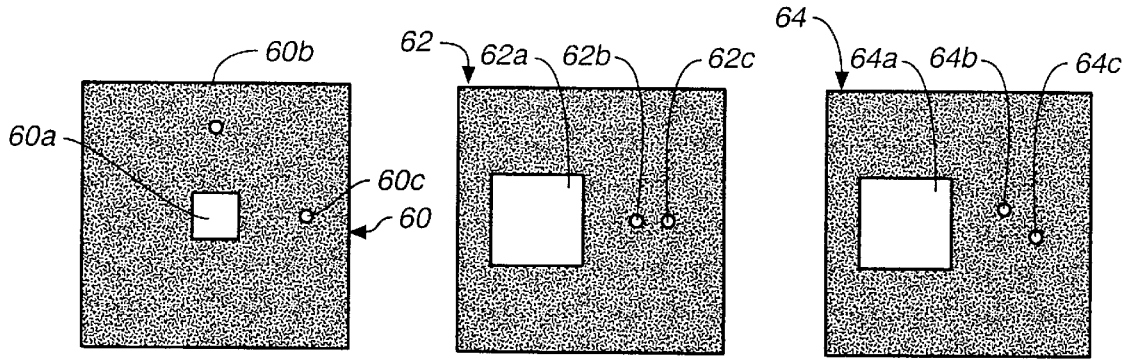
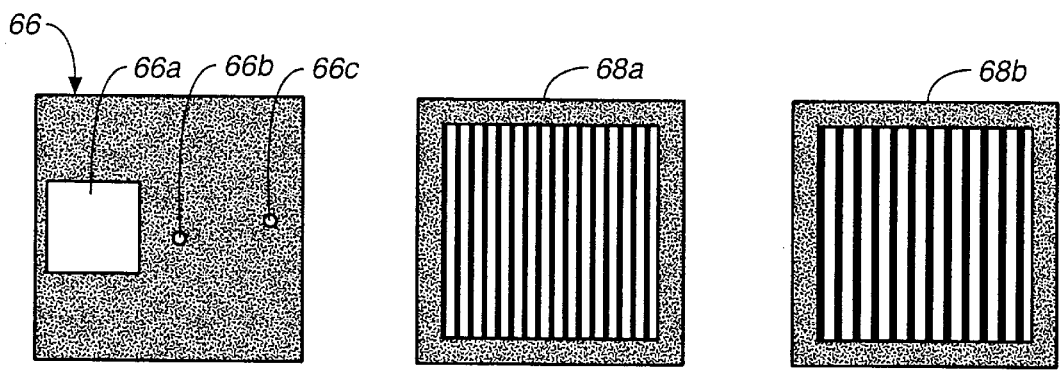
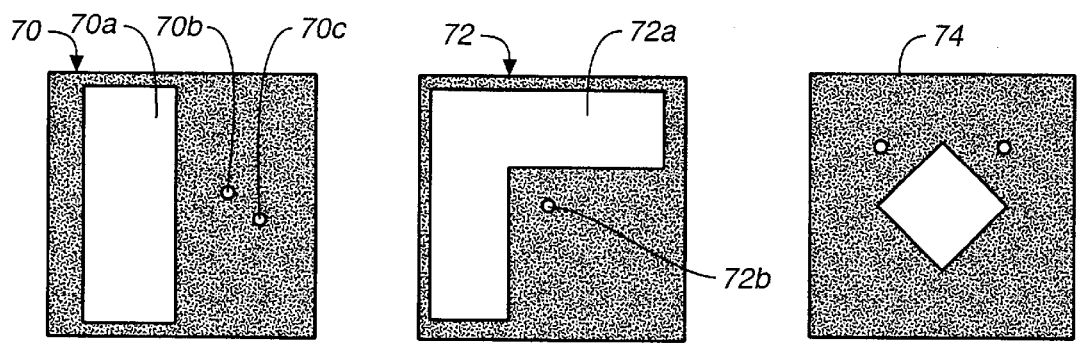
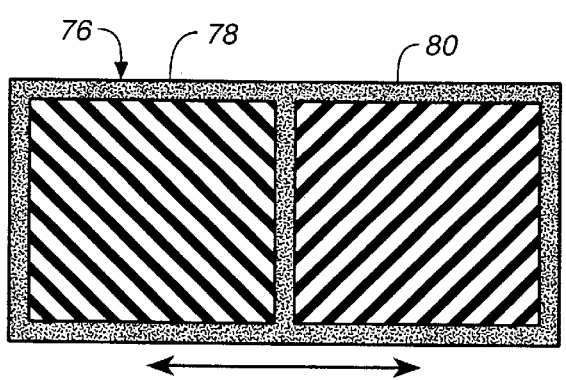
FIG._3    FIG._4A    FIG._4B
FIG._4C    FIG._4E    FIG._4F
FIG._5A    FIG._5B    FIG._6A
FIG._6B

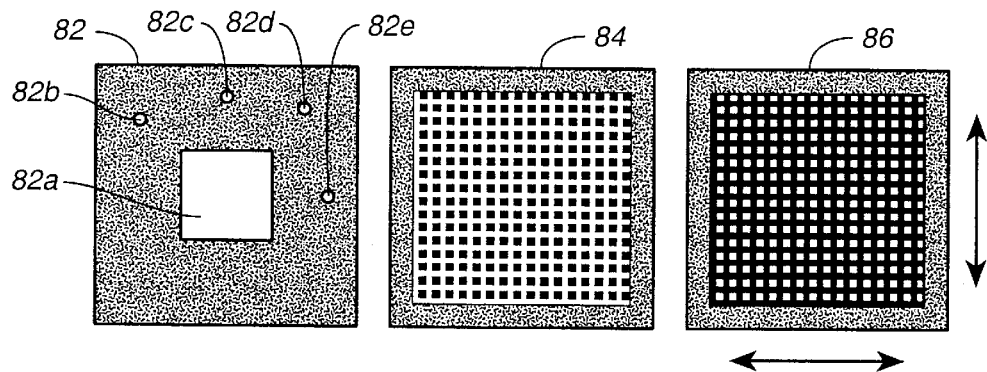
FIG._7A   FIG._7B   FIG._7C
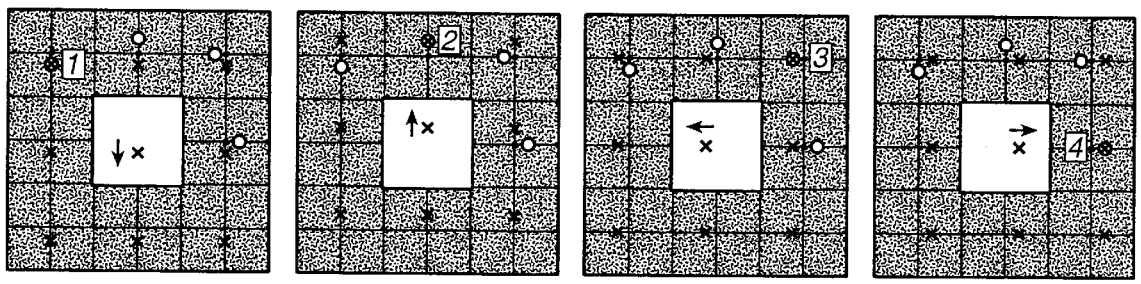
FIG._8A   FIG._8B   FIG._8C   FIG._8D
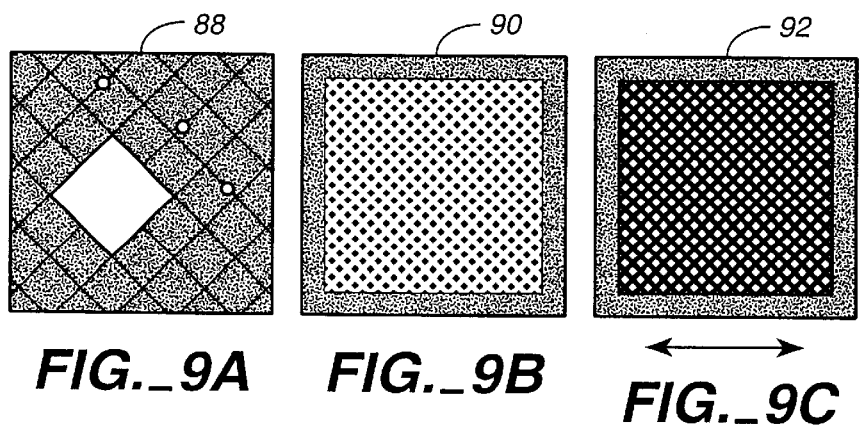
FIG._9A   FIG._9B   FIG._9C

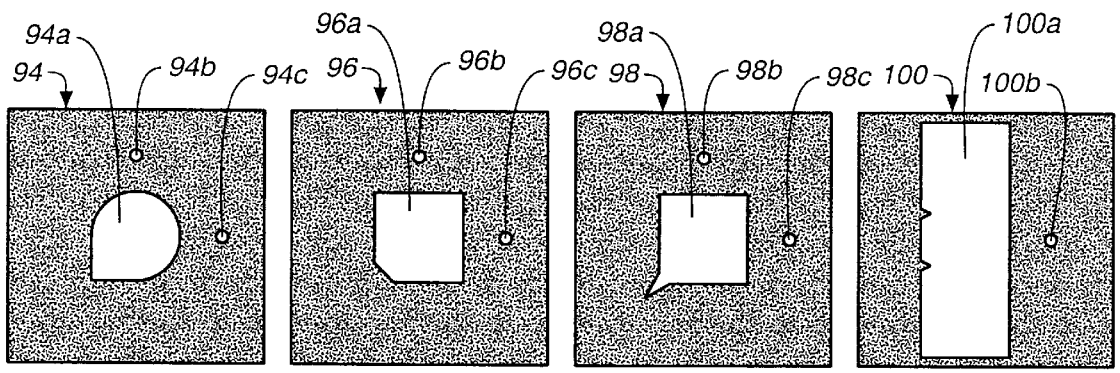
FIG._10A  FIG._10B  FIG._10C  FIG._10D
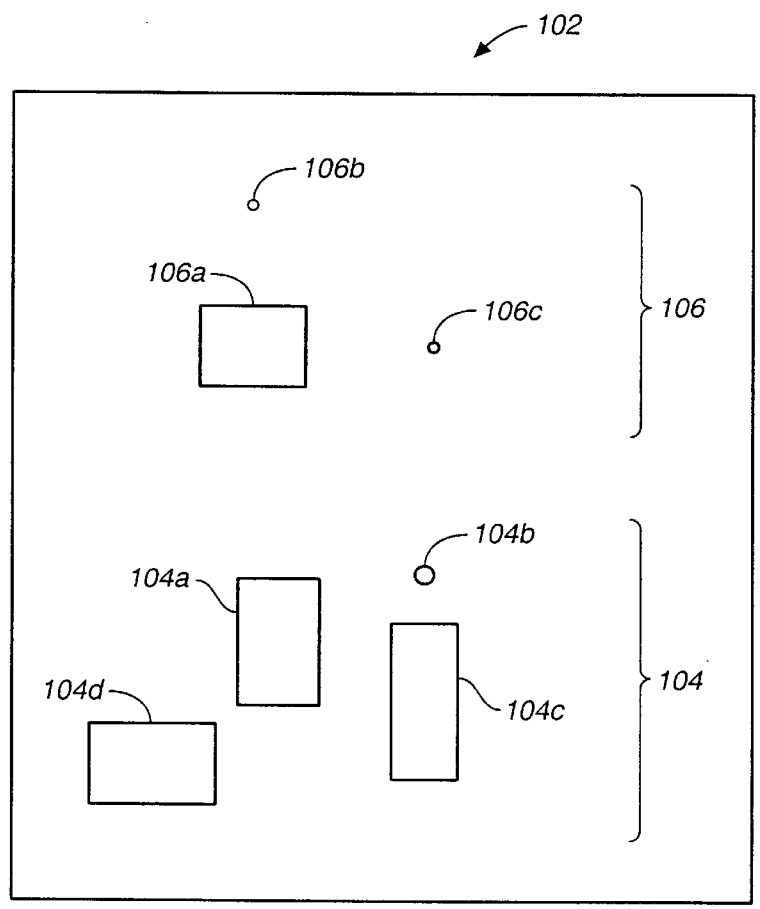
FIG._11

PHASE-SHIFTING POINT DIFFRACTION INTERFEROMETER MASK DESIGNS

The U.S. Government has certain rights in this invention pursuant to Contract No. DE-AC03-76SF00098 between the United States Department of Energy and the University of California for the operation of the Lawrence Berkeley National Laboratory.

BACKGROUND OF THE INVENTION

1. Field of the Invention

The present invention relates to interferometers for making highly accurate measurements of wavefront aberrations, particularly to phase-shifting point diffraction interferometers.

2. State of the Art

Optical metrology is the study of optical measurements. An area of optical metrology relevant to the present invention is the use of an interferometer to measure the quality of a test optic, such as a mirror or a lens.

One important recent application of optical metrology is the testing of projection optics for photolithography systems. Modern photolithography systems used to fabricate integrated circuits must continually image smaller features. To do so, systems are confronted with the diffraction limit of the light employed to image a pattern provided in a reticle. To meet this challenge, photolithographic systems must employ successively shorter wavelengths. Over the history of integrated circuit fabrication technology, photolithography systems have moved from visible to ultraviolet and may eventually move to x-ray radiation.

Because of the increasing difficulties posed by directly imaging a reticle pattern onto a wafer, it is desirable to use projection optics in lithography systems. Such systems include lenses or other optical elements that reduce the reticle images and project them onto the wafer surface. This allows reticles to retain larger feature sizes, thus reducing the expense of generating the reticle itself.

As with all optical elements, various aberrations such as spherical aberration, astigmatism, and coma may be present. These aberrations must be identified during the fabrication and/or testing of the projection optics, or the projection optics would introduce substantial blurring in the image projected onto the wafer.

In order to test the projection optics for various aberrations, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram and the resultant wavefront with, for example, Zernike polynomials, indicates the presence of aberrations.

The reference wave of the interferometer should be "perfect"; that is, it should be simple and well characterized, such as a plane or spherical wave. Unfortunately, beam splitters and other optics through which the reference beam passes introduce some deviations from perfection. Thus, the interferogram never solely represents the condition of the test optic. It always contains some artifacts from the optical system through which the reference wave passes. While these artifacts, in theory, can be separated from the interferogram, it is usually impossible to know that a subtraction produces a truly clean interferogram.

To address this problem, "point diffraction interferometers" have been developed. An example of a point diffraction interferometer is the phase-shifting point diffraction interferometer described in the article H. Medecki et al., "Phase-Shifting Point Diffraction Interferometer", *Optics Letters*, 21(19), 1526–28 (1996), and in the U.S. Patent Application "Phase-Shifting Point Diffraction Interferometer", Inventor Hector Medecki, Ser. No. 08/808,081, filed Feb. 28, 1997 now U.S. Pat. No. 5,835,217, which are both incorporated herein by reference. Referring to FIG. 1, in this prior art phase-shifting point diffraction interferometer 20, electromagnetic radiation is sent to a pinhole 22. The radiation is then sent through the test optic 24 to a grating 26. The grating 26 produces two beams with a small angular separation. An opaque mask placed near the focal point of the test optic, contains a tiny reference pinhole, and a larger window centered on the respective foci of the two beams. The reference pinhole produces a reference wavefront by diffraction, while the window transmits the test wave without significant spatial filtering or attenuation. In effect, the beam going through the reference pinhole is filtered to remove the aberrations so that this filtered beam can interfere with the test beam that passes through the window without significant spatial filtering. An interference pattern is detected at a detector 30. The light in the interferometer will typically be of a single wavelength. The grating 26 will transmit the zeroth-order beam straight through, but will produce a small angular change to the first-order diffractions. In the image plane, the zeroth-order, and the first-order diffractions will be in different positions, as indicated by the reference pinhole and the test window in the mask 28. Phase-shifting is provided by moving the grating 26 perpendicular to the rulings of the grating. Phase-shifting improves the efficiency and accuracy of the system.

It is desired to have an improved phase-shifting point diffraction interferometer.

SUMMARY OF THE PRESENT INVENTION

The present invention, generally speaking, concerns improved mask designs for use with a phase-shifting point diffraction interferometer. In one aspect, a mask is provided with a reference pinhole and a test window where the separation between the center of the test beam window and the center of the reference pinhole is greater than the width of the test beam window. This embodiment prevents some of the reference beam energy from passing through the test beam window. In practice, the reference beam and the test beam each contains a distribution of energy extending laterally away from its focal point. The quality of the test optic determines the energy profile of the beams, and in the presence of scatter, mid-spatial-frequency roughness, or inadequate beam separation, high-frequency components of the reference wave will "leak" through the test beam window. In this case, the window behaves as a bandpass filter for the reference beam, transmitting a narrow range of spatial frequencies along the direction of beam separation. These unfiltered components complicate the phase-shifting data analysis considerably. By selecting a test beam window that is smaller than the beam separation distance, the magnitude of the reference beam overlap will be decreased to improve the signal-to-noise ratio in the measured interference patterns.

In a second aspect, the mask has at least two reference beam pinholes where the distance between the first reference beam pinhole to the test beam window is not the same as the distance between the second reference beam pinhole and the test beam window. In this configuration only a single, one-dimensional grating and translation stage are required. In some instances, the requirement of either a pair of orthogonal translation stages, or a single translation stage which allows two directions of motion, can be prohibitively expensive. In this embodiment, the at least two reference beam pinholes can be positioned on the same side of the test beam window.

In a third aspect, the inventive mask includes an elongated test beam window. The test beam window can be elongated in the direction that is perpendicular to the beam separation direction to produce an improved spatial frequency response in the measurement direction away from the beam separation direction.

In a fourth aspect, the inventive mask employs gratings whose rulings have been rotated 45° with respect to a single grating translation stage. With this orientation, two different orientations of the grating can be phase-shifted using a single translation stage. In this configuration, the orientation of the reference pinhole and test beam window on the mask are rotated as well.

In a fifth aspect, a two-dimensional grating can be used. The two-dimensional grating will produce a square lattice pattern of diffracted orders. The pinholes can be positioned about the square lattice pattern so that by displacing the pinholes of the mask slightly from the uniform spacing, four or more reference pinholes can be used, one at a time, simply by introducing a slight translation to the test and reference beams, or to the mask.

In a sixth aspect, the test beam window has orientation marks added so as to help alignment and indication of the position of the reference beam pinhole. This is a concern because the reference beam pinhole is quite small and a highly symmetric test beam window will make it hard to identify the position of the reference pinhole.

In a seventh aspect, the invention is directed to a technique of producing marks on the masks separate from the test beam widow and the reference pinhole. These marks can be used for the alignment and focusing of the mask.

BRIEF DESCRIPTION OF THE DRAWING

The present invention may be further understood from the following description in conjunction with the appending drawing. In the drawing:

FIG. 1 is a diagram of a prior art phase-shifting point diffraction interferometer;

FIG. 2 is a diagram of a phase-shifting point diffraction interferometer which can use the masks and gratings of the present invention;

FIG. 3 is a diagram of a mask in which the width of the test beam window is smaller than the separation distance between a reference pinhole and the test beam window;

FIGS. 4A–4C are diagrams of masks in which the reference beam pinhole is positioned along the same direction of the test beam window;

FIGS. 4E–4F are diagrams of gratings used with the masks of FIGS. 4A–4C;

FIGS. 5A and 5B are diagrams of a mask in which the test beam windows have elongated configurations;

FIG. 6A is a diagram of a mask that is rotated 45°;

FIG. 6B is a diagram of two gratings for use with the mask of FIG. 6A;

FIG. 7A illustrates a mask for use with a two-dimensional grating;

FIGS. 7B and 7C are diagrams illustrating two-dimensional gratings for use with the mask of FIG. 7A;

FIGS. 8A–8D are diagrams illustrating the operation of the system so that a single reference beam passes through one of the four reference pinholes of FIG. 7A;

FIG. 9A illustrates a mask similar to the mask of FIG. 7A that has been rotated 45°;

FIGS. 9B and 9C are diagrams of two-dimensional gratings that have been rotated 45°;

FIGS. 10A–10D are diagrams of the mask designs in which the reference beam window has an indication that can illustrate the orientation of the mask;

FIG. 11 is a diagram of a mask used with one embodiment of the present invention in which orientation marks are added in addition to the reference pinhole and test beam window.

DETAILED DESCRIPTION OF THE PREFERRED EMBODIMENT

FIG. 2 illustrates a phase-shifting point diffraction interferometer 40 that is adapted to use the masks and gratings of the present invention. In one embodiment, the electromagnetic energy source 42 includes a lamp 46 and a pinhole 44 that produces a spatially coherent wave. The source of electromagnetic radiation could also be a laser that is spatially coherent without an input pinhole. The spatially coherent radiation impinges upon a beam divider 48 that creates two "perfect" beams with a small angular separation, a test beam 52 and a reference beam 50. The test beam 52 and reference beam 50 pass through the testing optic 54 which is to be evaluated for aberrations.

The beam divider 48 is preferably a transmission-type diffraction grating, but it could be a reflection-type diffraction grating, a double pinhole, a double mirror, or single mirror. The beam divider 48 is preferably, though not necessarily, located between the source of electromagnetic radiation and the test optic region.

Test optic 54, which may be a mirror, lens, etc., redirects the reference beam 50 and test beam 52 towards the image plane that contains the foci of the reference and test beams. The beam divider 48 causes the reference beam 50 and test beam 52 to have different laterally separated foci. Thus, the region of maximal intensity for the test beam 50 is separated from the region of maximal intensity for the reference beam 52 at the image plane where the mask 56 is located. Mask 56 is preferably positioned in the image plane. The test beam 52 passes through the relatively large test beam window 56a of the mask 56. This test beam is not substantially spatially filtered. The reference beam 50 goes through the reference pinhole 56b of the mask 56. The reference beam is thus filtered at the image point, and the reference beam 50 after the mask 56 constitutes a "perfect" spherical reference wave 53. The test wave 52 will interfere with the reference wave 53 at the detector 58 to generate the interference pattern. Various detectors may be employed including, for example, a camera with photosensitive film, a CCD array, and a video camera.

The size of the reference pinhole 56b on the mask 56 significantly influences the accuracy of the point diffraction interferometer. The reference pinhole must be smaller than the diffraction-limited focal spot of the optic under test. Thus, the pinhole diameter should approach the wavelength of the radiation. Additionally, a small pinhole ensures that there is sufficient divergence of the reference beam 53. The radiation emitted from the pinhole covers an angle given by the expression $$\alpha = \frac{1.22\lambda}{d}$$

where $\lambda$ is the radiation wavelength, d is the diameter of the pinhole, and $\alpha$ is the half-angle in radians. The "perfectness" of the reference wave is achieved by using a small pinhole at the expense of signal amplitude. A translation of the grating beam splitter 48 in the direction normal to the grating rulings produces a controllable phase shift between any two diffractive orders, and is used to implement phase-shifting interferometry. Between two adjacent orders, a translation of one cycle produces a relative phase shift of $2\pi$ radians, or one wave. Since small beam separations are typically used, the grating can be quite coarse, making fractional cycle translations easily achievable by the translation stage 49.

In a preferred embodiment, the phase-shifting point diffraction interferometer is employed in the measurement of multilayer-coated, all reflective EUV optical systems, operating in the 5–20-nm wavelength range, where the fabrication and alignment tolerances are in the sub-nanometer regime. The resolutions of these EUV optical systems, and correspondingly, the sizes of the reference pinholes used are on the order of 100-nm diameter. In one configuration, a two mirror optical system comprising 10×-demagnification Schwarzschild objectives with numerical apertures of 0.08 (image side) and measured system wavefront aberration magnitudes on the order of 1 nm root-mean-squared (rms) are employed. Placed approximately 60 mm from the entrance pinhole on the 0.008 NA (object side) of the test optics are grating beam splitters with 18-micron pitch, producing approximately 50 fringes within the measurement numerical aperture. Phase-shifting by translation of the beam splitter with quarter-cycle steps requires step sizes of 4.5 microns.

A number of improved mask designs are described with respect to FIGS. 3–11. All of the reference pinholes are shown much larger than actual size for diagram clarity.

FIG. 3 is a diagram illustrating a mask of the present invention. Mask 60 includes the test beam window 60*a* and reference pinholes 60*b* and 60*c*. As shown in FIG. 3, the size of the test beam window 60*a* is reduced relative to the beam separation distance. The beam separation distance is defined as the distance between the center of the test beam window 60*a* and the center of the reference pinholes 60*b* or 60*c* as the case may be. The width of the test beam window 60*a* is designed to be less than the test beam separation distances between the center of test beam window 60*a* and pinholes 60*b* and 60*c*.

By reducing the area of the test beam window 60*a*, the magnitude of the reference beam overlap with the test beam window is reduced. The quality of the test optic determines the energy profile of the beams, and in the presence of scatter, mid-spatial-frequency roughness, or inaccurate beam separation, high frequency components of the reference wave can leak through the test beam widow. By using a relatively narrow test beam window 60*a*, the level of the unfiltered components from the reference beam centered on the pinhole 60*b* and 60*c* is reduced. The unfiltered components of the reference beam that pass through the test beam window 60*a* could otherwise complicate the phase-shift point diffraction interferometer data analysis. In effect, the test beam spatial frequency resolution is sacrificed for improved signal-to-noise ratio in the measured interference patterns.

Mask 60 is shown with two different pinholes, 60*b* and 60*c*. In the present invention, only one of the reference pinholes is used at a time. As described below, by using the two reference pinholes at different times, some of the systematic aberrations can be removed from the wavefront of interest.

The displacement of beams in the image plane generates a large number of fringes in the interference pattern. The number and orientation of the fringes matches the portion of the grating that falls within the measurement numerical aperture. However, in the absence of re-imaging optics the displacement of the two spherical beams results in a measurable, systematic, higher-ordered aberration that arises purely from the geometry, namely the path length difference between the two beams upon reaching the detector. In particular, over a circular aperture, a systemic coma aberration is present with a magnitude dependent on the numerical aperture. The angle and magnitude of the coma is proportional to the tilt, which is easily measurable by the fringe orientation and density.

When the measurement numerical aperture is precisely known, the magnitude and direction of the coma may be inferred directly from the tilt, and then subtracted from the measurement. On the other hand, when the numerical aperture is not well known, a separate measurement recorded using each of the two reference pinholes to filter the reference beam can be combined to separate the systemic coma from the wavefront of interest. For this reason, two gratings mounted at 90 degrees have been used in the combination with the two reference pinholes. The vertical grating causes the reference beam to go to pinhole 60*c*, whereas the horizontal grating causes the reference beam to go to the pinhole 60*b*.

FIGS. 4A–4C illustrate another embodiment of the present invention in which the mask has two reference pinholes with different displacement magnitudes with respect to the center of the test beam widow. This is preferably done by having the reference pinholes along the same orientation of the test beam window. FIGS. 4A–C illustrate two pinhole configurations where the separation occurs along the same orientation with respect to the test beam window. In FIGS. 4A and 4B, two different gratings with the grating orientation in the same direction, but having different pitches, such as 68*a* and 68*b* shown in FIGS. 4E and 4F, are used to create the different beam separation magnitudes for the two different pinholes. Thus, FIG. 4A shows the mask 62 with the test beam window 62*a*, and reference pinholes 62*b* and 62*c*, and FIG. 4B shows a similar mask 64 with test beam window 64*c* and reference pinholes 64*b* and 64*c*. FIG. 4C shows an embodiment with a mask 66, test beam window 66*a*, a reference pinhole 66*b*, and second reference pinhole 66*c*. This embodiment can be used with a single grating. In this configuration, the zeroth-order beam is sent through the reference pinhole 66*b*, and one of the first-order diffracted beams is sent through the test beam window 66*a*. The mask is moved slightly in the vertical direction so that the zeroth-order beam no longer passes through the reference pinhole 66*b*, but the first-order diffraction beam is used as the reference beam, passing through the reference pinhole 66*c*.

A significant advantage of the configurations of FIGS. 4A–4C is that a single one-dimensional translation stage accomplishes the phase-shifting. Looking at the mask of FIG. 3, since both vertical and horizontal gratings are used with the two different reference pinholes 60*b* and 60*c*, in order to do phase-shifting, two different translation stages, or a two-dimensional translation stage is required. In some cases, an additional orthogonal stage or simple stage with two directions of motion may be a limiting concern.

FIGS. 5A and 5B are diagrams that illustrate masks having elongated test beam windows which can achieve a high spatial frequency response. Referring to FIG. 5A, the mask 70 has a test beam window 70a which is elongated in the direction that is perpendicular to the beam separation direction. The width of the test beam window 70a is constrained in the direction of the beam separation in order to prevent energy from the reference beam from leaking into the test beam window 70a. However, in the direction that is orthogonal to this direction, there is no such limitation. Thus, the spatial frequency response can be significantly extended along one measurement direction at a time. FIG. 5B is a diagram of a mask 72 which illustrates a two directional design, wherein the single pinhole 72b receives the zeroth-order energy in both grating configurations. The test beam energy would either go through the top or side portion of the L-shaped test beam window 72a depending on the orientation of the grating used. The position of the zeroth-order beam is not changed as the beam separation is rotated by 90 degrees. By combining measurements made in two directions, the spatial frequency response can be expanded to a "cross" in the frequency domain.

FIG. 6B is a diagram of a plate 76 containing gratings 78 and 80. By rotating the gratings 45 degrees with respect to the single grating translation stage, phase shifting and beam separation can be achieved in two orthogonal directions, using only a single stage. The two sections 76 and 80 of the grating are used separately to achieve the orthogonal beam separation. The grating translation required to produce a single cycle phase shift is √2 greater than the period of the grating. FIG. 6A shows a mask 74 which has been rotated by 45 degrees so that it can be used with the gratings of FIG. 6B.

FIGS. 7B and 7C are two-dimensional gratings which can be used with the present invention. Two-dimensional gratings are, in effect, created by the superposition of two orthogonal grating patterns into a single grating. FIG. 7B illustrates a 75% open, two dimensional grating 84. FIG. 7C illustrates a 25% open, two dimensional grating 86. Both two-dimensional gratings 84 and 86 produce a square lattice pattern of diffracted orders. In this fashion, as shown in FIG. 7A, a number of pinholes can be used in series to generate many different beam separation directions. By displacing the pinholes 82b–82e slightly from the uniform grid pattern, each individual pinhole can be selected for use simply by inducing a slight translation to the test and reference beams or to the mask. This intentional pinhole displacement avoids confusion that occurs when two or more reference beams pass through pinholes. Mask 82 includes test beam window 82a.

FIGS. 8A–8D are diagrams that illustrate the alignment of the various beams with each of four pinholes. In FIG. 8A, the reference beam passes through the pinhole labeled 1. In FIG. 8B, the reference beam passes through the pinhole labeled 2. In FIG. 8C, the reference beam passes through the pinhole labeled 3. In FIG. 8D, the reference beam passes through the reference pinhole labeled 4. FIGS. 8A–8D illustrate the small displacement of the mask or the beams required to match up the reference beam with the pinhole. By using four different beam separation directions, one can identify and subtract the systemic effects that introduce aberrations dependent on the beam separation direction.

FIGS. 9A–9C are diagrams that illustrate a mask 88 and a two dimensional grating 90, 92 with 45° rotation. By using a 45° rotation to the two-dimensional grating, only a single one-dimensional translation stage is required for phase-shifting, as described above with respect to FIGS. 6A and 6B.

With the two dimensional grating patterns, the ratio of open to opaque area can be varied from 0 to 100%. As the duty cycle and the grating period varies, so do the relative intensities of the diffracted orders. Matching the relative intensities is an important consideration when trying to achieve good fringe contrast in the interferograms, and thus high signal to noise ratios in the measurement.

TABLE 1

Comparison of the beam intensities from the various simple one-dimensional and two-dimensional configuration. The ratio of first-order to zeroth-order intensities is shown in parenthesis.

| case | zeroth-order | 1st-order | 1x,1y-order |
| --- | --- | --- | --- |
| no grating | 1.000 | N.A. | N.A. |
| 1-D, 50% open | 0.250 | 0.107 (43%) | N.A. |
| 2-D, 25% open | 0.063 | 0.027 (43%) | 0.011 (18%) |
| 2-D, 75% open | 0.563 | 0.027 (5%) | 0.011 (2%) |

Table 1 shows the relative intensities for several configurations under consideration. Although the 25% open configuration of the two-dimensional grating has the lowest overall throughput relative to the zeroth-order, it offers a large amount of light diffracted into both the four first-order beams (43% each) and the four xy first-order beams (18% each).

If it is anticipated that the reference pinhole will reduce the intensity of the reference beam by a factor of ten or more, then the 75% open configuration of the two-dimensional grating, used in the zeroth-order reference configuration, is appropriate.

Further discussion of the advantage of using the zeroth-order configuration is described in the U.S. Patent Application, "Phase-Shifting Point Diffraction Interferometer Grating Designs", inventor, Naulleau et al., Ser. No. 09/176,695 (corresponding to Attorney Docket No. 015780-027) which was filed on the same day as the present application, and is incorporated herein by reference.

FIGS. 10A–10D show masks using orientation marks placed on the test beam windows. In FIGS. 10A and 10C, on masks 94 and 98, an extension has been made to the test beam windows 94a and 98a as an orientation mark. In FIGS. 10B and 10D, and indentation has been made to the test beam windows 96a and 100a as an orientation mark. Note that the orientation marks need not be on the same side as the pinhole to indicate the position of the pinholes. Test beam window 100a, shown in FIG. 10D, has two indentation marks to illustrate the position of the reference pinhole 100b.

FIG. 11 shows mask 102 which has alignment and focusing marks 104 along with the reference pinholes 106b and 106c, and test beam window 106a (mask portion 106). The alignment and focusing marks 104 can include a large, easy to find pinhole 104a. The marks are used to determine the degree of defocus interferometrically. Where the grating angle with respect to the pinholes is unknown or adjustable, or where the beam separation is unknown, the window marks 104b, 104c, and 104d can be used. The mask can be adjusted so that the zeroth-order passes through mark 104b and the first-order through the large pinhole 104a. The mask can then be shifted-up so that the zeroth-order goes through window 104b and a first-order goes through window 104c. Then the mask 102 could be shifted vertically as shown so the two first-orders go through the windows 104d and 104c for even greater beam separation. In a preferred embodiment, the windows are small to reduce the transmission of scattered light when using nearby reference pinholes.

It will be appreciated by those of ordinary skill in the art that the invention can be embodied in other specific forms without departing from the spirit or essential character thereof. For example, different embodiments can be combined together. For example, orientation marks and the 45° rotation of the grating and mask can be used with a number of different embodiments.

The presently disclosed embodiments are therefore considered in all respects to be illustrative and not restrictive. The scope of the invention is indicated by the appended claims, rather than the foregoing description, and all changes which come within the meaning and range of equivalence thereof are intended to be embraced therein.

What is claimed is:

1. A point diffraction interferometer system defining an optical path comprising:
    a source of electromagnetic energy in the optical path;
    a beamsplitter in the optical path for dividing light from the source into a reference beam and a test beam;
    at least one optical element under test in the optical path;
    a mask in the optical path positioned in an image plane; and
    a detector in the optical path positioned after the mask; wherein the mask defines a test beam window and at least one reference beam pinhole, wherein the separation between the center of the test beam window and the center of the at least one pinhole is greater than the width of the test beam window so that at least some of the reference beam energy is prevented from passing through the test beam window.

2. The point diffraction interferometer system of claim 1, wherein the beamsplitter is a diffraction grating.

3. The point diffraction interferometer system of claim 2, wherein the diffraction grating is a transmission-type diffraction grating.

4. The point diffraction interferometer system of claim 2, wherein the diffraction grating is positioned between the source and the at least one optical element under test.

5. The point diffraction interferometer system of claim 1, wherein the image plane includes a focal point of the reference beam passing through at least one optical element.

6. The point diffraction interferometer system of claim 1, wherein the source includes an input pinhole.

7. A point diffraction interferometer system defining an optical path comprising:
    a source of electromagnetic energy in the optical path;
    a beamsplitter in the optical path for dividing light from the source into a reference beam and a test beam;
    at least one optical element under test in the optical path;
    a mask in the optical path positioned in an image plane; and
    a detector in the optical path positioned after the mask; wherein the mask defines a test beam window and at least two reference beam pinholes, wherein the at least two reference beam pinholes are positioned at different distances from the test beam window.

8. The point diffraction interferometer system of claim 7, wherein the beamsplitter comprises diffraction gratings and wherein the at least two reference beam pinholes are positioned so that diffraction gratings of a single orientation can be used.

9. The point diffraction interferometer system of claim 7, wherein the at least two reference beam pinholes are positioned along a single side of the test beam window.

10. The point diffraction interferometer system of claim 7, wherein the at least two reference beam pinholes are positioned for two different test and reference beam separations.

11. The point diffraction interferometer system of claim 10, wherein the two different test and reference beam separations that are orthogonal.

12. A point diffraction interferometer system defining an optical path comprising:
    a source of electromagnetic energy in the optical path;
    a beamsplitter in the optical path for dividing light from the source into a reference beam and a test beam;
    at least one optical element under test in the optical path;
    a mask in the optical path positioned in an image plane; and
    a detector in the optical path positioned after the mask; wherein the mask defines a test beam window and at least one reference beam pinhole, wherein the test beam window is elongated.

13. The point diffraction interferometer system of claim 12, wherein the test beam window is elongated in a direction orthogonal to a line in the beam separation direction that is between the at least one pinhole and the center of window.

14. The point diffraction interferometer system of claim 12, wherein the test beam window is L-shaped.

15. A point diffraction interferometer system defining an optical path comprising:
    a source of electromagnetic energy in the optical path;
    a pair of diffraction gratings, at least one of the pair of diffraction gratings being positioned in the optical path for dividing light from the source into a reference beam and a test beam, the diffraction gratings having rulings that are orthogonal to one another, the at least one of the pair of diffraction gratings being positioned on a translation stage to allow phase shifting;
    at least one optical element under test in the optical path;
    a mask in the optical path positioned in an image plane; and
    a detector in the optical path positioned after the mask; wherein the mask defines a test beam window and at least one reference beam pinhole.

16. The point diffraction interferometer system of claim 15, wherein the pair of diffraction gratings are on a single beamsplitter grating device that is positioned on the translation stage to allow phase shifting.

17. The point diffraction interferometer system of claim 15, comprising two diffraction gratings that have rulings that are oriented at 90 degrees from each other and that are oriented at 45 degrees from a stage translation direction which is perpendicular to a beam propagation direction.

18. The point diffraction interferometer system of claim 15, wherein the translation stage is adapted to move along a single orientation.

19. A point diffraction interferometer system defining an optical path comprising:
    a source of electromagnetic energy in the optical path;
    a beamsplitter grating in the optical path for dividing light from the source into a reference beam and a test beam, the beamsplitter grating being a two-dimensional grating;
    at least one optical element under test in the optical path;
    a mask in the optical path positioned in an image plane; and
    a detector in the optical path positioned after the mask; wherein the mask defines a test beam window and more than two reference beam pinholes.

20. The point diffraction interferometer system of claim 19, wherein the pinholes are positioned so that different translations of the mask can cause each pinhole to be selected one at a time.

21. A point diffraction interferometer system defining an optical path comprising:
   a source of electromagnetic energy in the optical path;
   a beamsplitter in the optical path for dividing light from the source into a reference beam and a test beam;
   at least one optical element under test in the optical path;
   a mask in the optical path positioned in an image plane; and
   a detector in the optical path positioned after the mask; wherein the mask defines a test beam window and at least one reference beam pinhole wherein the mask further comprises at least one alignment mark to help indicate the correct position of the mask wherein the at least one mask includes an orientation pinhole larger than the reference beam pinhole.

22. The point diffraction interferometer system of claim 21, wherein the at least one mark includes additional windows.

23. A point diffraction interferometer system defining an optical path comprising:
   a source of electromagnetic energy in the optical path;
   a beamsplitter grating in the optical path for dividing light from the source into a reference beam and a test beam, the beamsplitter grating being a two-dimensional grating;
   at least one optical element under test in the optical path;
   a mask in the optical path positioned in an image plane; and
   a detector in the optical path positioned after the mask; wherein the mask defines a test beam window and at least one reference beam pinhole, wherein the pattern of the two-dimensional grating is not oriented parallel to a translation direction of the two-dimensional grating.

24. The point diffraction interferometer system of claim 22, wherein the pinholes are positioned so that different translations of the mask can cause each pinhole to be selected one at a time.

25. A point diffraction interferometer system defining an optical path comprising:
   a source of electromagnetic energy in the optical path;
   a beamsplitter grating in the optical path for dividing light from the source into a reference beam and a test beam, the beamsplitter grating being a two-dimensional grating;
   at least one optical element under test in the optical path;
   a mask in the optical path positioned in an image plane; and
   a detector in the optical path positioned after the mask; wherein the mask defines a test beam window and at least one reference beam pinhole, wherein the pattern of the two-dimensional grating is oriented with an angle of 45 degrees from a translation direction of the two-dimensional grating.

26. The point diffraction interferometer system of claim 25, wherein the pinholes are positioned so that different translations of the mask can cause each pinhole to be selected one at a time.

* * * * *